United States Patent [19]

Miller et al.

[11] Patent Number: 5,079,501
[45] Date of Patent: Jan. 7, 1992

[54] FLEXIBLE MEMBRANE CIRCUIT TESTER

[75] Inventors: Brian S. Miller, Stafford; David R. Kaplan, Burke, both of Va.

[73] Assignee: The United States of America as represented by the Secretary of the Army, Washington, D.C.

[21] Appl. No.: 658,804

[22] Filed: Feb. 22, 1991

Related U.S. Application Data

[62] Division of Ser. No. 551,370, Jul. 10, 1990, Pat. No. 5,055,776.

[51] Int. Cl.$^5$ ............................ G01R 1/02; G01R 1/04
[52] U.S. Cl. ................................ 324/158 P; 324/158 F
[58] Field of Search ............. 324/72.5, 158 R, 158 P, 324/158 F, 158 D, 96, 636; 439/482

[56] References Cited

U.S. PATENT DOCUMENTS

| | | | |
|---|---|---|---|
| 4,758,785 | 7/1988 | Rath | 324/158 F |
| 4,820,976 | 4/1989 | Brown | 324/158 F |
| 4,891,584 | 1/1990 | Kamieniecki et al. | 324/158 D |
| 4,906,920 | 3/1990 | Huff et al. | 324/158 F |
| 4,912,399 | 3/1990 | Greub et al. | 324/158 F |

Primary Examiner—Kenneth A. Wieder
Assistant Examiner—Vinh P. Nguyen
Attorney, Agent, or Firm—Milton W. Lee; Anthony T. Lane

[57] ABSTRACT

A pattern of electrodes, with electrical lead lines to the electrodes, are carried by a thin-film membrane mounted on a frame. The pattern corresponds to a test point pattern on a circuit to be tested. The lead lines go to edge connectors on the frame. In order to test a circuit, the membrane is pushed against the test points by air pressure, such that capacitive coupling occurs between the electrodes and the test points.

1 Claim, 3 Drawing Sheets

FLEXIBLE MEMBRANE CIRCUIT TESTER

The invention described herein may be manufactured, used, and licensed by the U.S. Government for governmental purposes without the payment of any royalties thereon.

This application is a division, of application Ser. No. 07/551,370, files July 10, 1990, now U.S. Pat. No. 5,055,776.

BACKGROUND OF INVENTION

This invention is in the field of testing devices for integrated electronic circuits. It is particularly concerned with and arose from the need to test wafers with infrared detector arrays thereon. Prior to hybridizing (adding a readout device thereto) it is desirable to test the operability of the diodes of the array, this is done to eliminate faulty arrays from further expensive processing. The current technique is to use sharpened probes to contact indium bumps test points connected on the wafers to the diodes. This technique has problems of probe alignment with the bumps, propensity for probe indused damage, and the propensity for probes to stick to the bumps during contact. If capacitive testing rather than actual contact is used, it is difficult to maintain a fixed probe distance from the test points (bumps). The present invention overcomes these problems by eliminating sharpened probes and employing a thin, flexible membrane with capacitively-coupled planar probes thereon.

SUMMARY OF THE INVENTION the invention is embodiments of a tester for infrared diode arrays on a substrate (chip) and methods of making such testers. The testers include essentially planar electrodes carried by a flexible membrane which also carries connecting leads to the probes. In use, the membrane is pressed against test points on the substrate such that capacitive coupling occurs between the electrodes and the test points when a test voltage is applied.

DESCRIPTION OF PREFERRED EMBODIMENTS OF THE INVENTION

Figure 1:
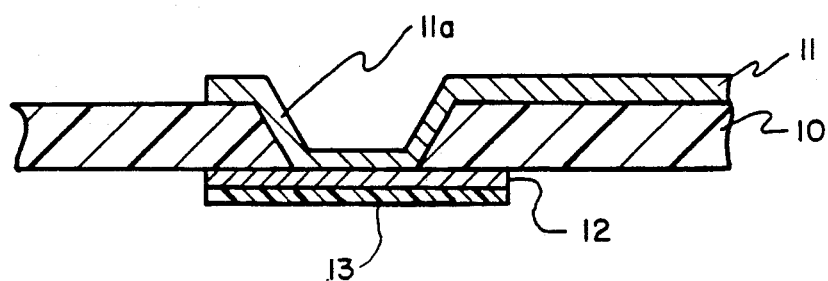
FIG. 1 is a partial cross-sectional view of one embodiment of the invention.

The invention may perhaps be best understood by referring to the drawings. Regarding the FIG. 1 embodiment, we see (not to scale) a test probe including a relatively thin film membrane 10 (on the order of a mil thick) made of a low-dielectric constant material such as Mylar. Atop 10 we see a portion of lead line 11, which has a portion 11a extending through 10 and in contact with electrode 12. This electrode is covered with a layer of a high-dielectric material such as alumina. It should be understood that a multiplicity of these test probes will be supported by a single membrane, as will be described in FIG. 4.

Figure 2:
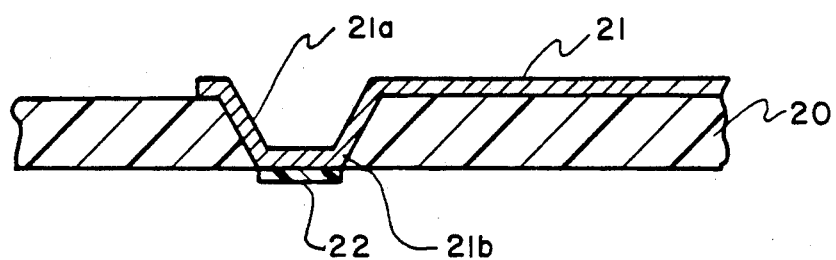
FIG. 2 is a partial cross-sectional view on another embodiment of the invention, taken in direction 2—2 on FIG. 4.

Turning now to FIG. 2, we see membrane 20 supporting lead line 21. This lead line has a portion 21a extending through 20 and with a bottom electrode portion 21b coplanar with the opposite side of 20 from 21. Finally, this coplanar portion 21b is covered by a high-dielectric constant layer 22. The bottom portion 21b of lead line 21 functions as an electrode in the test rig as herein below described, and the portion of lead line shown as 21a interconnects the lead line 21 with the electrode portion 21b to assure good electrical contact therewith.

Figure 3:
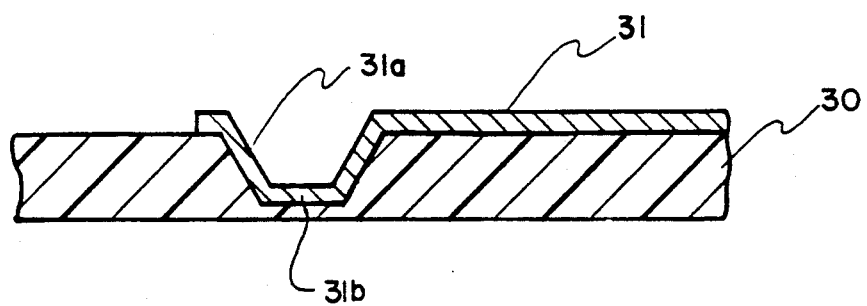
FIG. 3 is a partial cross-sectional view of yet another embodiment of the invention.

In FIG. 3, membrane 30 carries lead line 31a, with portion 31 extending into 30, and bottom portion 31b. As can be seen, 31a–31b do not extend all the way through membrane 30.

The portion of lead line 31, referred to as 31a and 31b, performs the same functions, respectively, as the elements 21a and 21b, above described in reference to FIG. 2.

Figure 4:
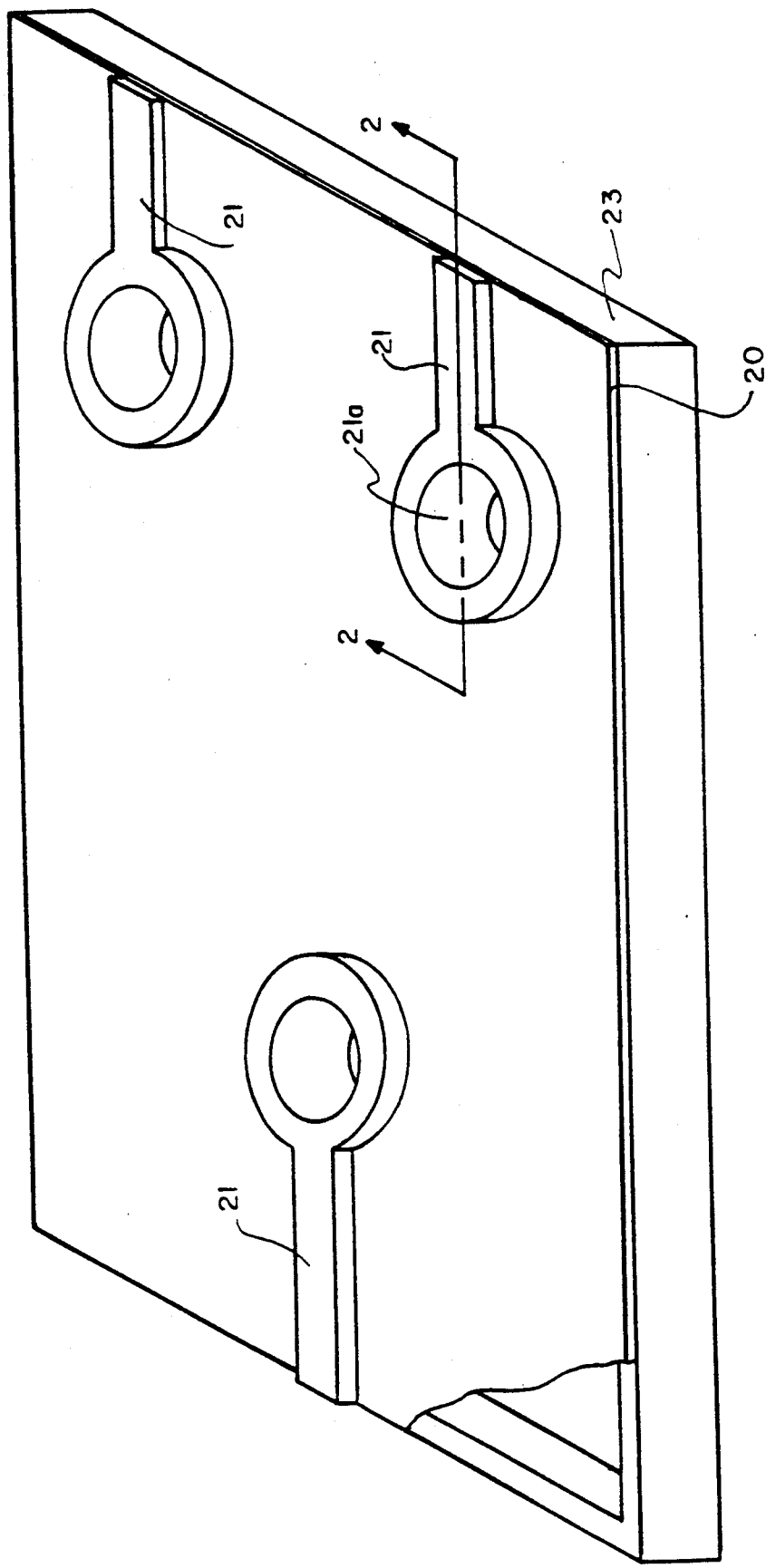
FIG. 4 is an isometric view of a simplified version of the invention, partially cut away.

Looking now at FIG. 4, we see a very simplified version of one embodiment of the invention. Membrane 20, described above in the FIG. 2 embodiment is supported by frame 23. Each probe has its lead line extending to the edge of the frame, where connections to an external test circuit are made. In an actual embodiment of the invention, it should be understood that dozens or many hundreds of test probes may be carried by a frame. The physical size of the frame will be determined by the size of the circuit under test. the size of the probes is determined by the test point size on the circuit under test. A typical size is on the order of a mil. The thickness of the lead lines is not critical, but will be on the order of 1/10 micron.

Figure 5:
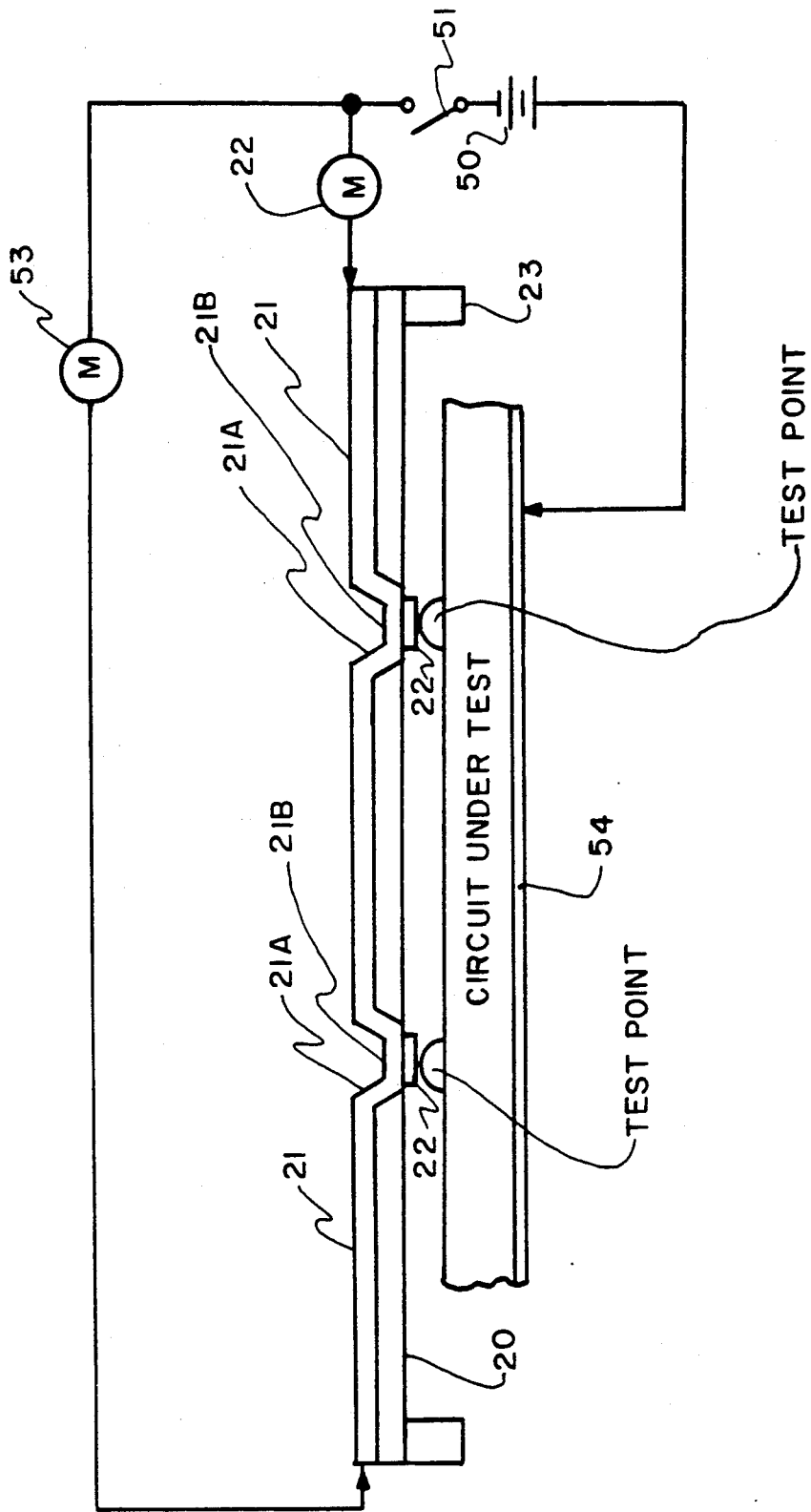
FIG. 5 shows a side view of a typical embodiment of the invention with a circuit under test.

In use, the circuit or chip under test, as shown in FIG. 5, is held in a testing rig, the inventive device, as shown in FIG. 4, is placed over the circuit under test and in registration therewith, and differential air pressure is applied to cause intimate contact between the circuit and the device. The testing rig includes means to electronically couple the test circuit to the various lead lines of the device. In FIG. 5, a circuit under test is shown with two representive test points coupled to electrodes 21b through dielectric pads 22. A voltage source 50, activated by switch 51, is coupled to the ground plane 54 of the circuit under test and to leas lines 21 of the test rig. The circuit is then tested by applying appropriate voltages to the various lead lines and measuring the desired electrical characteristics, such as capacitance or inpedance vs displacement current, by the appropriately placed meters, as shown representatively in FIG. 5, as meters 51 and 53.

The methods by which the various embodiments are made are similar in some respects, but vary in others. All methods begin with the selection or preparation of a suitable frame in accordance with the circuit to be tested. The thin membrane is then applied to this frame by any desired method, such a stretching a layer of the membrane over the frame and bonding the two together adhesively or otherwise. In the FIG. 1 embodiment, a patern of electrodes (such as 12 in FIG. 1) is lithographically applied to the membrane. Holes are then formed through the membrane from the side opposite to the electrodes, using laser ablation of lithographic techniques. These holes are concentric with but of smaller diameter than the electrodes. After a proper lithographic mask is applied, lead line (such as 11 in FIG. 1) are deposited, with portions extending through the membrane and making contact with respective electrodes. Finally, a high-dielectric constant layer (such as 13 in FIG. 1) is applied over the electrodes by the usual lithographic methods.

In the FIG. 2 embodiment, it is necessary to deposit or apply a removable layer on one side of the membrane. Holes are then formed through the membrane from the side opposite the removable layer. After this opposite side is properly masked, lead line (such as 21 in FIG. 2) are deposited, with portion (such as 21a) extending through the membrane to the removable layer. This removable layer is then removed and a high-dielectric constant layer is applied to the newly exposed portions of the lead lines (such as 22 in FIG. 2). An example of a material for the removable layer is sodium silicate, which is differentially soluble. Alternatively, a high dielectric constant material may be used to initially form the pads 22 on the membrane, after which holes are formed in the membrane and leads deposited.

The FIG. 3 embodiment is the simplest to make. Depressions are formed into the frame-mounted membrane by laser ablation or some lithographic technique and lead lines are deposited with portion extending into the depressions by some lithographic technique.

Although the various methods have been described as using lithographic techniques, it would obviously be possible to employ reusable masks held against the membrane. Moreover, ion milling and other techniques might be used for forming holes through or perforations into the membrane. Even though the invention has been directed to planar devices it would be possible to use the inventive techniques to form devices capable of testing non-planar circuits. In this case, a precurved frame might be employed, or the frame might be formed into its final shape after the membrane is applied, etc. Also, a flexible frame may be used. Even with a planar frame, the very nature of the thin membrane with differential air pressure will permit contacting non planar test points.

A tester made in accordance with the teachings herein has several advantages over the prior testers for integrated circuits. For example, since no sharp probes are used, the chance of damage to a circuit is minimal. Moreover, since no ohmic contact is required, variations in test readings which might result from improper contact are eliminated. Further, variations in topography of a circuit under test are automatically compensated for by the flexibility of the membrane.

We claim:

1. A device for testing a planar electrical circuit having a plurality of test points thereon, said device including:
a relatively rigid frame having an open portion;
a dielectric thin membrane attached to said frame and spanning said open portion;
a plurality of electrodes carried by said membrane;
a respective electrical lead line from each of said electrodes to an edge of said frame, whereby said frame may be juxtaposed with respect to said planar electrical circuit such that the electrodes of said membrane are in close proximity to respective test points on said circuit whereby capacitive coupling is established between each of said test points and a respective electrode when a test voltage is applied to a respective lead line, wherein said membrane includes a plurality of depressions extending essentially therethrough with said electrodes lying at the bottom of said depressions, and said lead lines lying on the surface of the membrane with portions extending into the depressions to interconnect each electrode with a respective lead line.

* * * * *